United States Patent [19]

Thrasher et al.

[11] Patent Number: 5,475,889
[45] Date of Patent: Dec. 19, 1995

[54] AUTOMATICALLY ADJUSTABLE BRUSH ASSEMBLY FOR CLEANING SEMICONDUCTOR WAFERS

[75] Inventors: David L. Thrasher; Lynn Ryle, both of Santa Clara, Calif.

[73] Assignee: OnTrak Systems, Inc., Milpitas, Calif.

[21] Appl. No.: 275,774

[22] Filed: Jul. 15, 1994

[51] Int. Cl.⁶ .................................................. A46B 13/02
[52] U.S. Cl. ................................................ 15/88.3; 15/77
[58] Field of Search ...................... 15/21.1, 88.2, 15/88.3, 77, 102, 309.2

[56] References Cited

U.S. PATENT DOCUMENTS 4,382,308  5/1983  Curcio ............................................ 15/77

FOREIGN PATENT DOCUMENTS

| 986262 | 3/1976 | Canada | 15/77 |
| 6000464 | 1/1994 | Japan | 15/77 |
| 1090462 | 5/1984 | U.S.S.R. | 15/77 |
| 1389882 | 4/1988 | U.S.S.R. | 15/77 |
| 850461 | 10/1960 | United Kingdom | 15/77 |

*Primary Examiner*—Edward L. Roberts, Jr.
*Attorney, Agent, or Firm*—Flehr, Hohbach, Test, Albright & Herbert

[57] ABSTRACT

An automatically adjustable brush assembly for cleaning semiconductor wafers. The brush assembly includes a first rotary brush, a brush carriage having first and second arms and a second rotary brush, and at least one pressure adjustment assembly positioned to engage at least one of the arms of the brush carriage and configured for automatically adjusting the pressure applied to the wafer surfaces by the first and second rotary brushes. The brush assembly further includes a control system coupled to the pressure adjustment assembly for controlling operation of the pressure adjustment assembly to selectively increase and decrease the pressure applied to the wafer by the first and second rotary brushes.

21 Claims, 7 Drawing Sheets

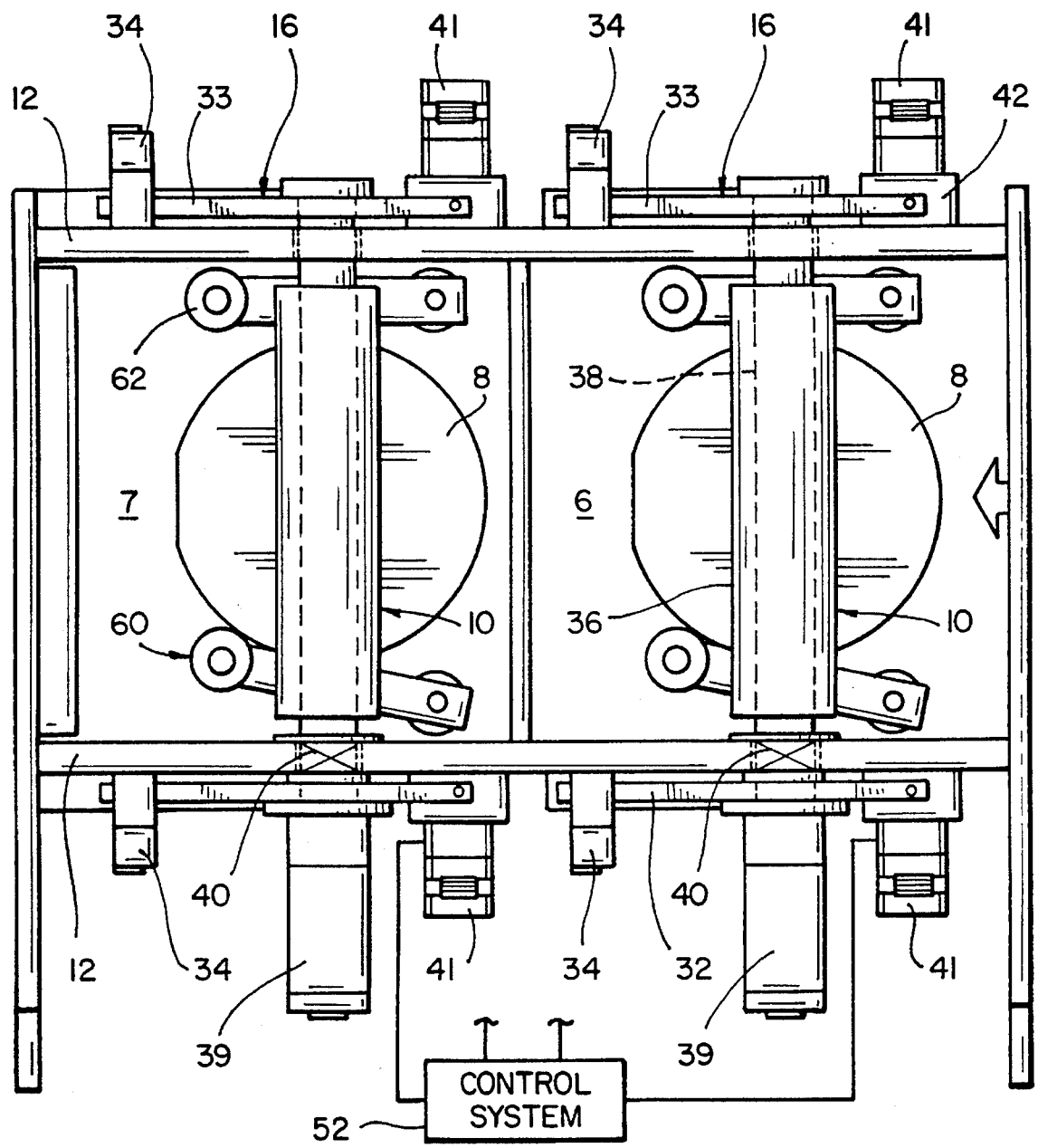
FIG_1

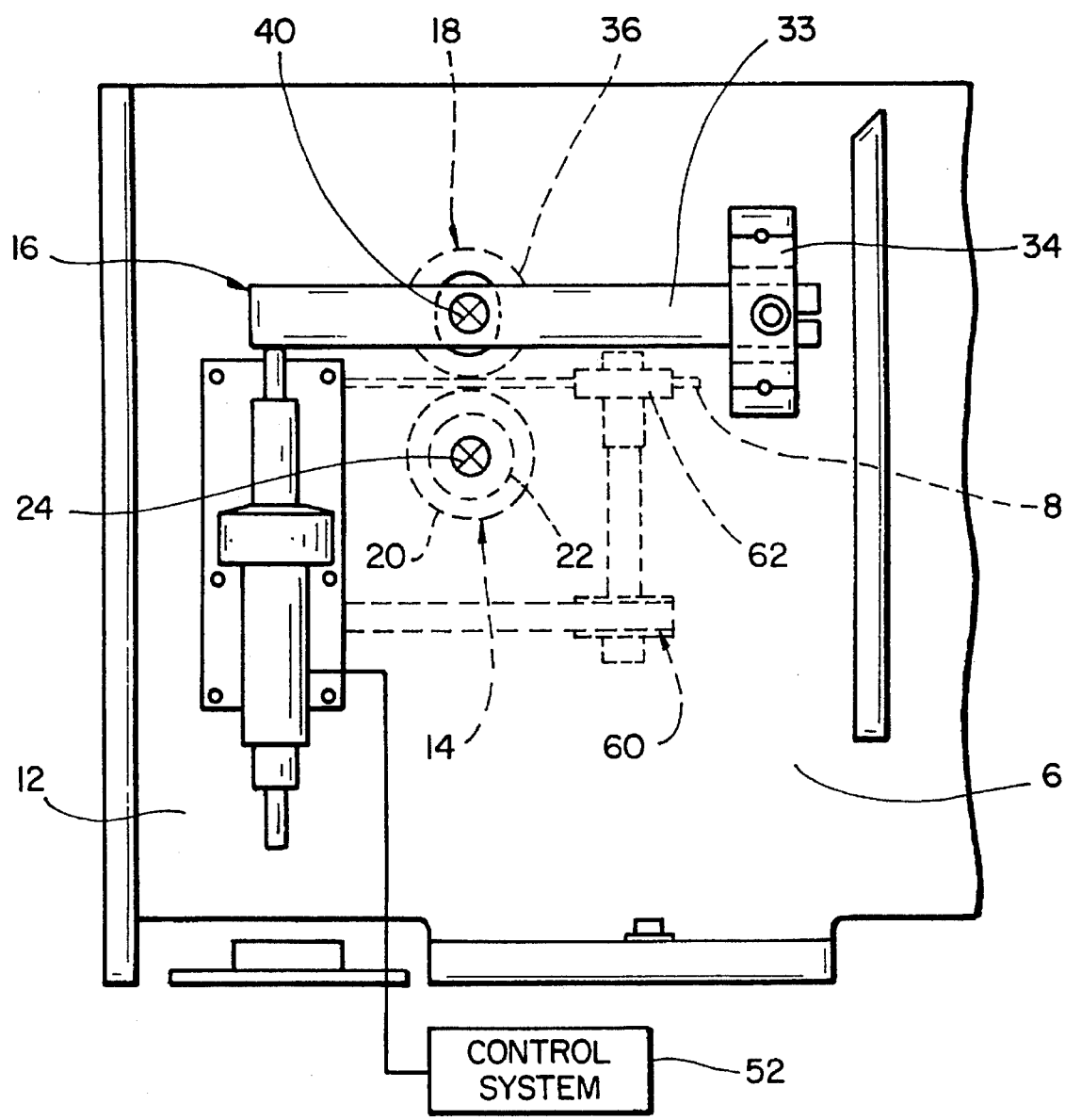
FIG_2

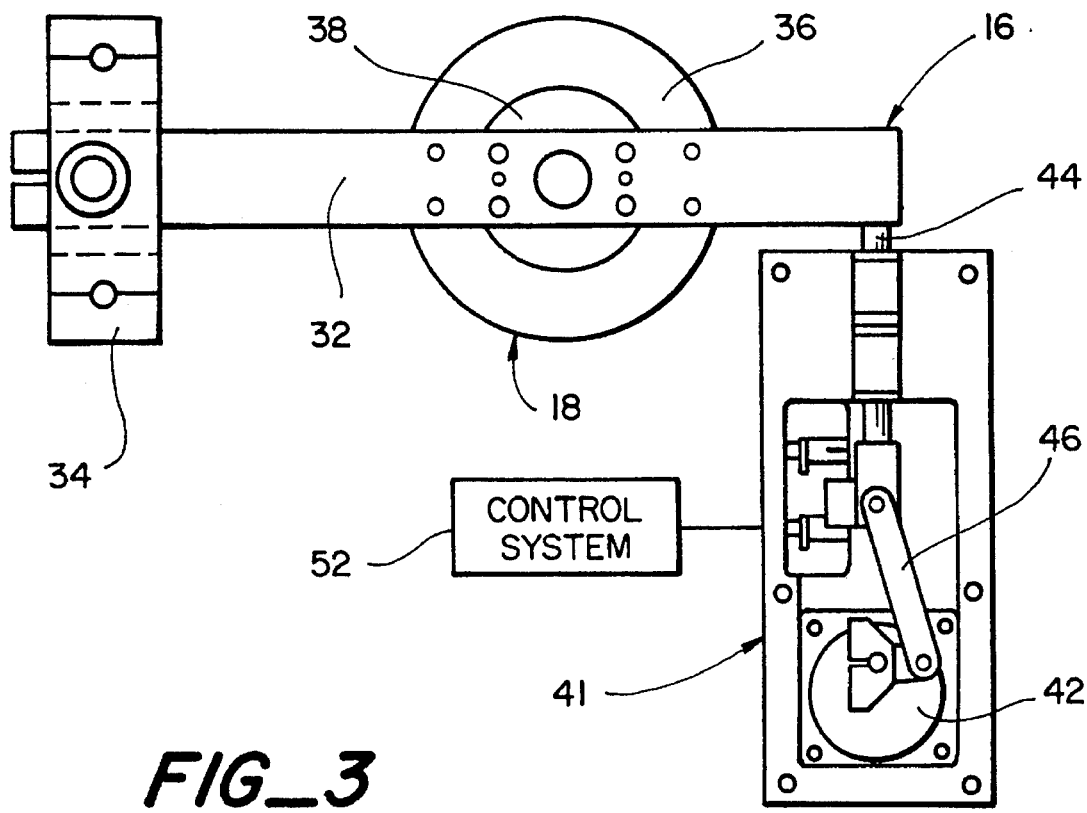
FIG_3
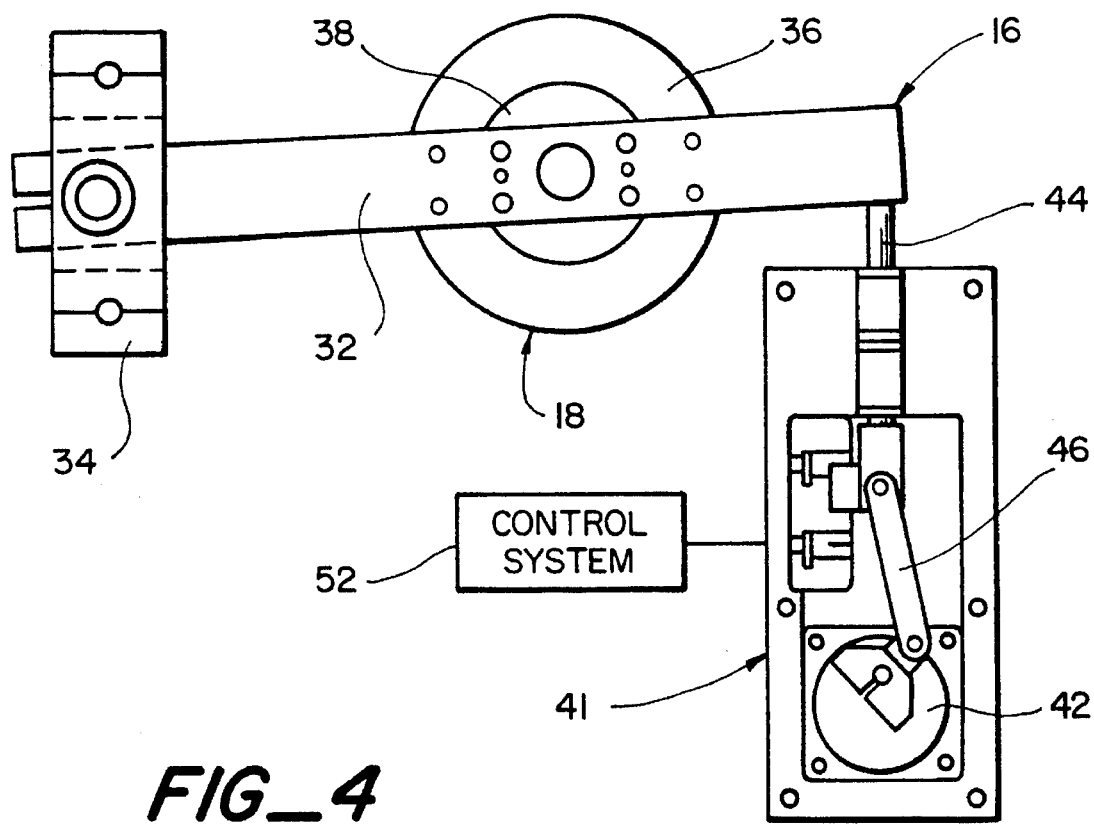
FIG_4

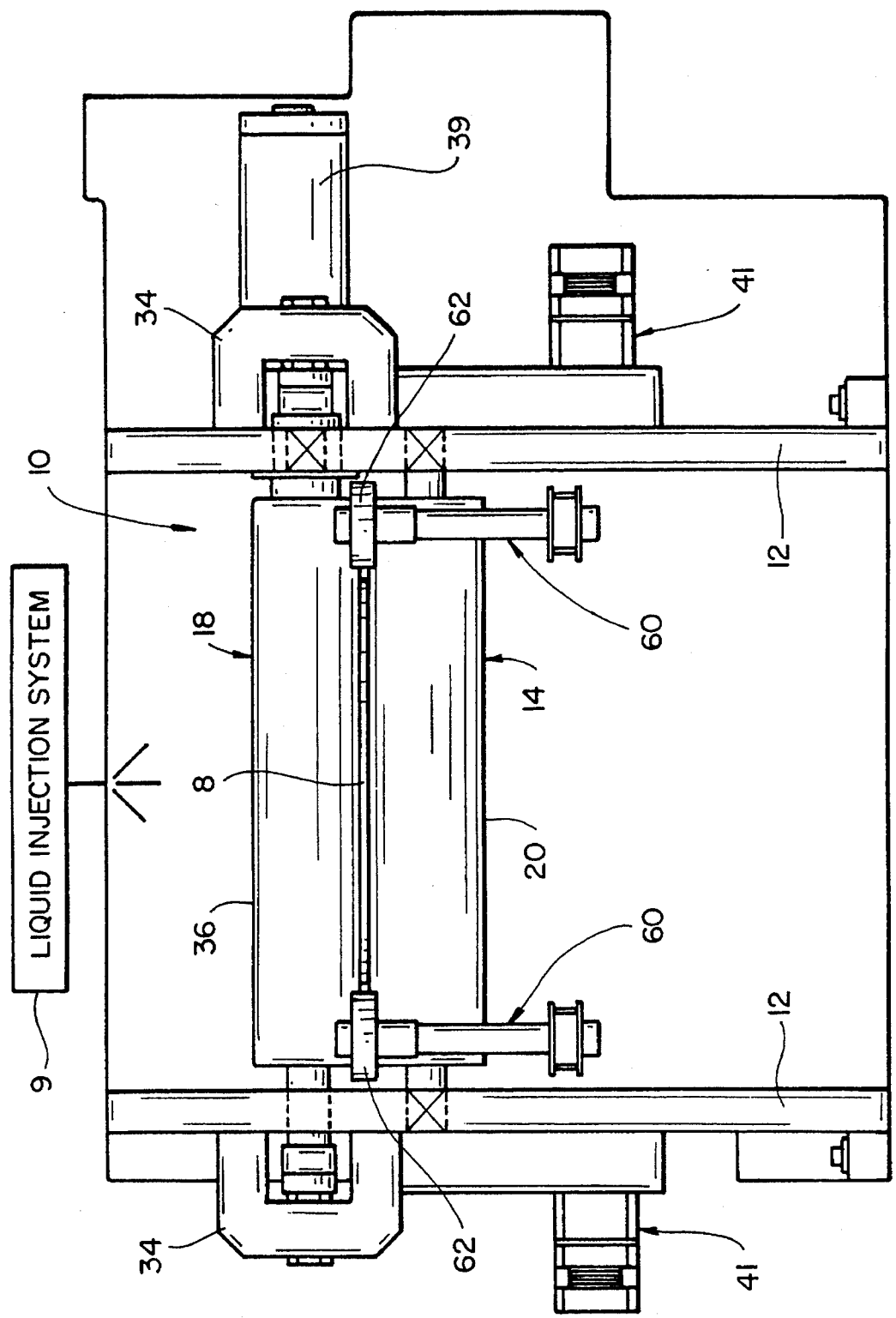

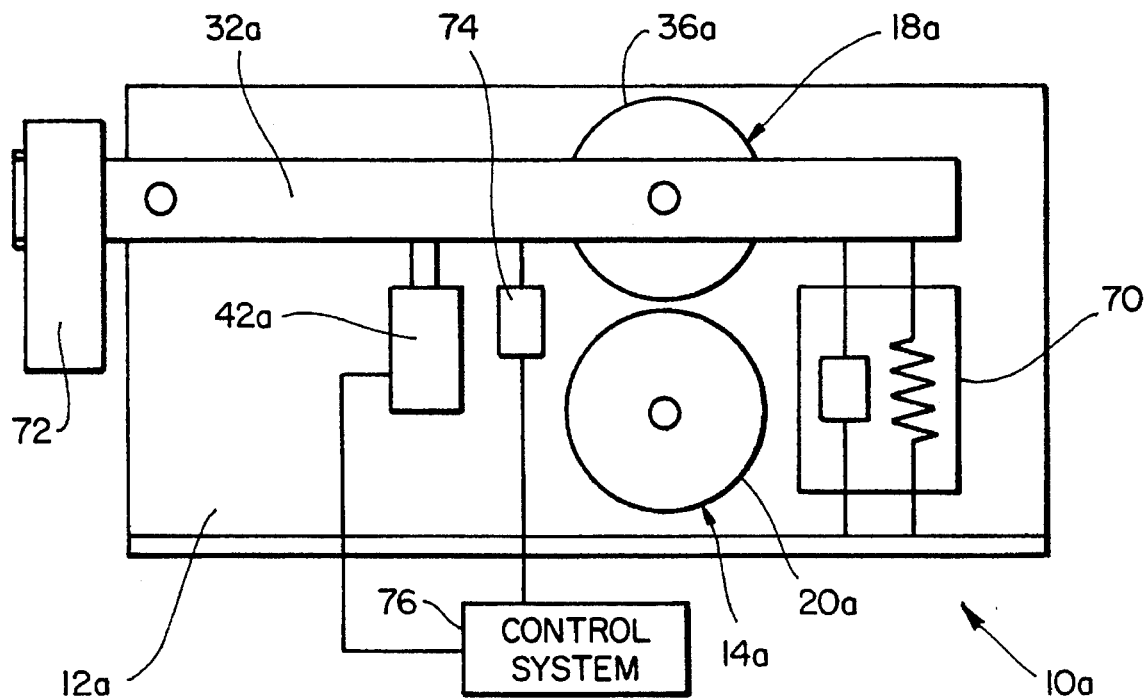
FIG_6
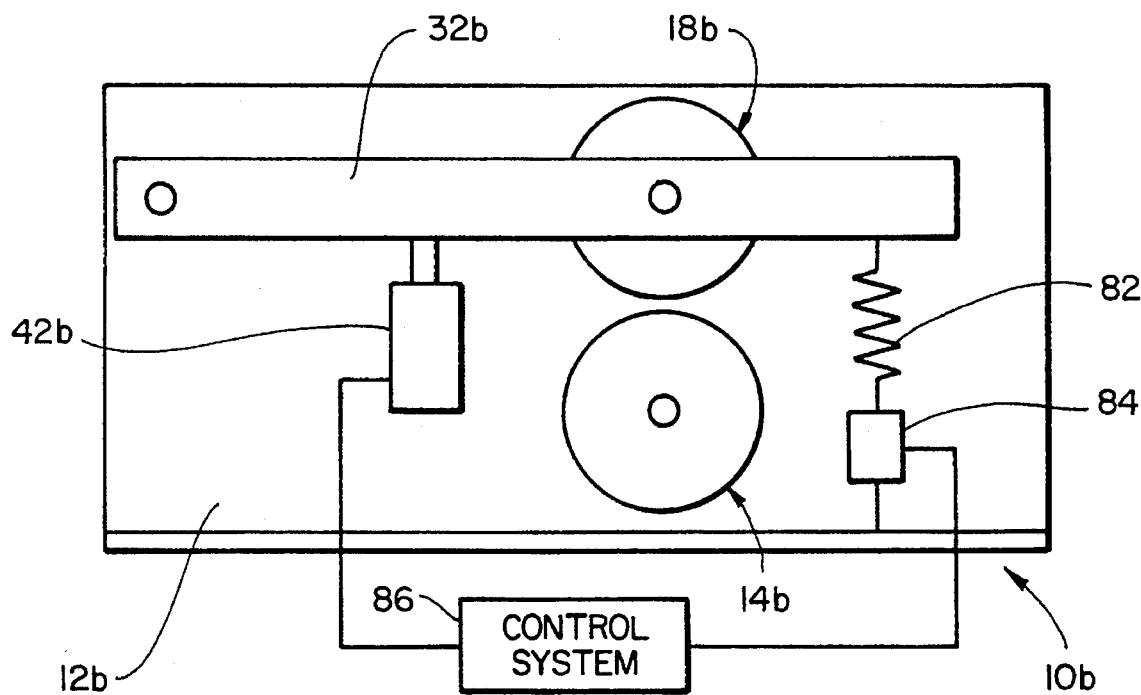
FIG_7

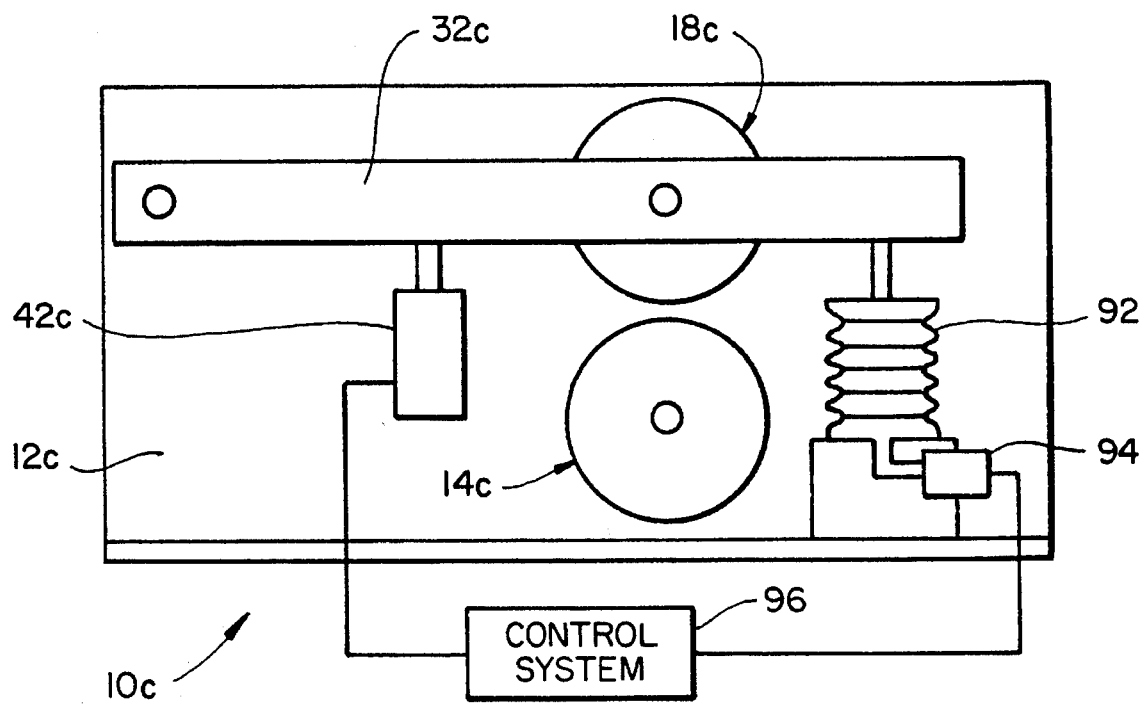
FIG_8
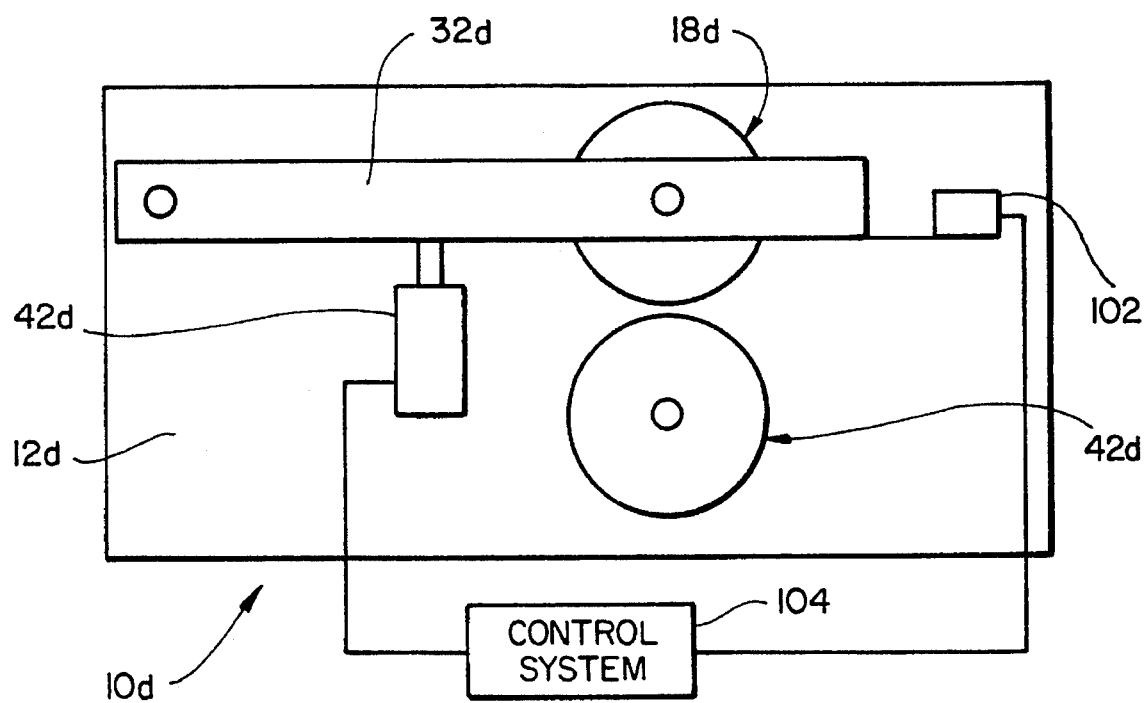
FIG_9

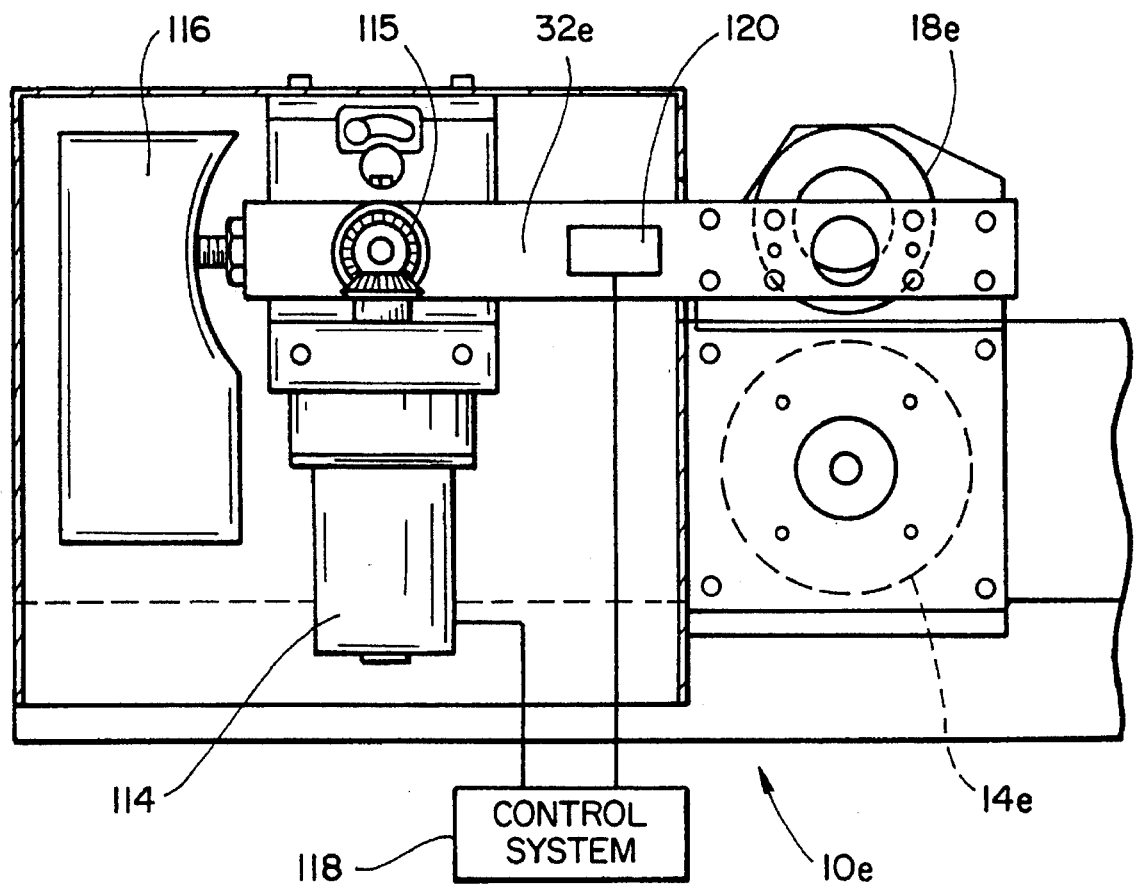
FIG_10
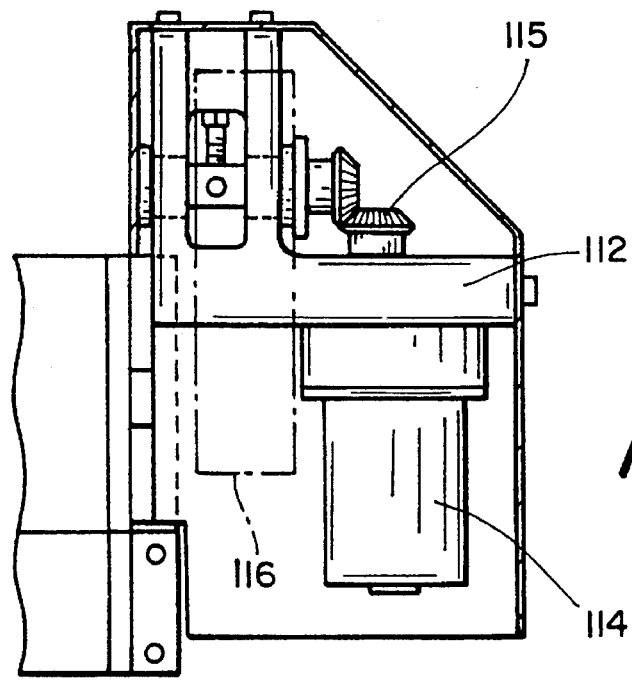
FIG_11

AUTOMATICALLY ADJUSTABLE BRUSH ASSEMBLY FOR CLEANING SEMICONDUCTOR WAFERS

BACKGROUND OF THE INVENTION

The present invention relates in general to a cleaning machine for cleaning the surfaces of semiconductor wafers. More particularly, the present invention relates to an adjustable brush assembly for cleaning semiconductor wafers.

Semiconductor wafers are typically cleaned in a cleaning machine which includes one or more brush stations each having a pair of rotary brushes for cleaning the upper and lower surfaces of the wafer. When the wafer is positioned between the brushes, the rotary brushes apply pressure across the wafer surfaces to clean the wafer. A pair of stop assemblies engage the forward edge of the wafer to retain the wafer between the brushes and spin the wafer so that the entire surface area may be cleaned by the brushes. One or more liquid agents are sprayed onto the wafer or the brushes to facilitate cleaning of the wafer. After a set period of time, the stop assemblies are pivoted away from the wafer and the wafer is allowed to pass through the brush station into either another brush station or a final spin station where the wafer is rotated at speeds of approximately 2000 rpm to dry the cleaned wafer.

The cleaning pressure applied to the wafer by the upper and lower brushes is dependent upon the thickness of the wafer and the spacing between the brushes. Preferably, the surfaces of the upper and lower brushes are substantially parallel so that a uniform pressure may be applied to clean the wafer surface. In the brush stations of the available cleaning machines, the lower brush is typically retained in a fixed position. The upper brush is secured to a rigid brush carriage assembly having a transverse bar pivotally mounted to the frame of the machine. The orientation of the brush carriage is manually calibrated so that the upper brush is substantially parallel to the lower brush. Micrometers positioned at opposite sides of the brush carriage are used to manually adjust the height of the brush carriage to obtain the desired spacing between the brushes. This spacing determines the pressure that will be applied to the wafer.

Manually calibrating the position of the brush carriage each time wafers having different thicknesses are cleaned or the brushes are changed is a tedious, time consuming, inefficient and labor intensive process. The micrometers often become jarred during operation of the cleaning machine, moving the brush carriage out of alignment and requiring readjustment of the brush assembly to ensure that the desired cleaning pressure is uniformly applied across the wafer surfaces. Since the brush carriage appears to be a rigid assembly, the operator often elects to use only one micrometer to calibrate the position of the brush carriage. As only one micrometer is then used to support the brush carriage during the cleaning operation, the carriage may deform and more frequent calibration of the brush carriage may be required. The pressure applied to the wafer surfaces changes as the brushes wear, requiring readjustment of the spacing between the brushes. If the brushes do not wear evenly, both the orientation and height of the upper brush must be recalibrated to maintain a uniform pressure across the wafer surfaces. Since the thickness and surface topology of semiconductors wafers varies, more pressure may be applied to some wafers than others. Moreover, if the wafer thickness is not uniform, the brushes will not apply an even pressure across the wafer surfaces. Even if the cleaning machine is closely monitored, many wafers may leave the brush station in an unsatisfactory condition.

The present invention provides an adjustable brush assembly which includes an automated pressure adjustment assembly, such as a support assembly, coupled to a control system for automatically adjusting the pressure applied to the wafers by the brushes. In one embodiment, the control system may be configured with a predetermined height schedule which accommodates predicted changes in spacing due to brush wear. In another embodiment of the invention, the control system has a closed-loop configuration which measures the pressure applied to the wafers during the cleaning cycle and automatically adjusts the brush assembly to ensure that a uniform pressure is applied to the wafers throughout the operating cycle of the cleaning machine. Automatically adjusting the height of the upper brush substantially minimizes the time and labor required to prepare the brush station for operation. Moreover, by adjusting the brush assembly during the cleaning cycle, the cleaning pressure applied to the wafers may be more precisely controlled.

SUMMARY OF THE INVENTION

In summary, the present invention provides an adjustable brush assembly for cleaning semiconductor wafers. The brush assembly includes a first rotary brush and a brush carriage having first and second arms and a second rotary brush. The second rotary brush extends between the first and second arms and is parallel to the first rotary brush. The second rotary brush is spaced from the first rotary brush by a distance such that during operation of the brush assembly, the first and second rotary brushes apply a selected cleaning pressure to a semiconductor wafer positioned between the first and second rotary brushes. The brush assembly further includes at least one pressure adjustment assembly positioned to engage one of the arms of the brush carriage for selectively increasing and decreasing the pressure applied to the wafer surfaces by the rotary brushes. One such pressure adjustment assembly is a support assembly which supports the brush carriage in a selected one of a plurality of positions. The support assembly is configured for reciprocating movement of the brush carriage to selectively increase and decrease the distance between the first and second rotary brushes so that the selected cleaning pressure may be applied to the surfaces of the wafer. A control system coupled to the support assembly controls operation of the pressure adjustment assembly to selectively increase and decrease the pressure applied to the wafers by the first and second rotary brushes.

BRIEF DESCRIPTION OF THE DRAWINGS

Additional objects and features of the invention will be more readily apparent from the following detailed description and appended claims when taken in conjunction with the drawings, in which:

FIG. 1 is a top plan view of an adjustable brush assembly in accordance with the present invention, shown mounted to the frame of a cleaning machine.

FIG. 2 is a side plan view of the brush assembly of FIG. 1.

FIG. 3 is an enlarged, side plan view of the brush carriage and support assembly, shown with the brush carriage supported in a first position.

FIG. 4 is a view similar to FIG. 3, shown with the brush carriage supported in a second position.

FIG. 5 is an end view, partially broken away, of the brush assembly of FIG. 1.

FIG. 6 is a schematic side view of an adjustable brush assembly in accordance with another embodiment of the present invention.

FIGS. 7–9 are schematic side views similar to FIG. 6 of other embodiments of the invention.

FIG. 10 is a side elevational view, partially broken away, of yet another embodiment of an adjustable brush assembly in accordance with the present invention.

FIG. 11 is a end view, partially broken away, of the brush assembly of FIG. 10.

DESCRIPTION OF THE PREFERRED EMBODIMENT

Reference will now be made in detail to the preferred embodiment of the invention, which is illustrated in the accompanying figures. Turning now to the drawings, wherein like components are designated by like reference numerals throughout the various figures, attention is directed to FIGS. 1–5.

FIGS. 1–5 show a pair of brush stations 6 and 7 of a cleaning machine for cleaning semiconductor wafers 8. An automatically adjustable brush assembly 10 in accordance with the present invention is positioned in each brush station 6 and 7 and mounted to the frame 12 of the cleaning machine for uniformly cleaning semiconductor wafers 8. During operation of the machine, a wafer cassette (not shown) positioned to the right of the first brush station 6 individually feeds the semiconductor wafers 8 into the first brush station. The brush assembly 10 engages the wafer 8 and cleans the wafer surfaces as is described in more detail below. The wafer 8 passes from the first brush station 6 to the second station 7 where it is cleaned by a second brush assembly 10. As is known in the art, liquid agents alone or in combination such as citric acid, deionized water, ammonium hydroxide, hydrogen peroxide, etc. may be sprayed or injected into each brush station by an injection system 9 (shown schematically in FIG. 5) to facilitate cleaning of the wafers 8. From the second brush station 7, the wafer 8 is moved to a spin station (not shown) where the wafer is rotated at high speeds to dry the wafer. The cleaned wafer is ejected from the spin station and deposited in a second cassette (not shown). The construction and operation of the wafer cassettes, spray injectors and spin station is known in the art.

As shown particularly in FIGS. 1 and 2, the brush assembly 10 includes a lower rotary brush 14 and a brush carriage 16 having an upper rotary brush 18 for cleaning the surfaces of the semiconductor wafer 8. In the illustrated embodiment, the lower brush 14 generally includes a sleeve 20 carried by a lower roller 22. Bearings 24 rotatably mount the roller 22 to the frame 12, securing the lower brush 14 in a fixed position relative to the frame 12. A motor (not shown) carried by the frame and coupled to one end of the lower roller 22 drives the brush 14 in a counter-clockwise direction to polish the lower surface of the wafer 8 and move the wafer forward through the brush station 6.

The brush carriage 16 includes a pair of spaced support arms 32 and 33 mounted to the frame 12 by pivots members 34. The upper brush 18 extends between and is mounted to the support arms 32 and 33. As is shown particularly in FIGS. 1 and 3, the upper brush 18 is spaced from the pivot members 34 to minimize the horizontal displacement of the upper brush 18 relative to the lower brush 14 when the support arms are pivoted. In the present embodiment, the upper brush 18 includes a sleeve 36 mounted to an upper roller 38. In the preferred form, the upper roller 38 is gimballed or mounted to the support arms 32 and 33 by spherical bearings 40 provided on the opposite ends of the roller 38. The spherical bearings 40 permit multidirectional movement of the upper brush 16 relative to the support arms 32 and 33.

With the spherical bearings, the elevation of the support arms 32 and 33 may be independently adjusted. For example, if the thickness of one or both of the sleeves 20 and 36 is uneven, the upper roller 38 may be tilted at an angle so that the surfaces of the sleeves 20 and 36 are parallel. If the support arms 32 and 33 are retained at different elevations, the support arms 32 and 33 are separated by a distance greater than the separation between the support arms when the arms 32 and 33 are at the same elevation. In the present embodiment, the tolerances of the spherical bearings accommodate the slight change in the distance separating the arms 32 and 33 when they are retained at different heights. However, in some applications it may be desirable to incorporate a spline assembly which permits longitudinal displacement of the upper brush 18 when one of the support arms 32 and 33 is moved relative to the other support arm. However, it should be understood that other means may be used to mount the upper roller 38 to the support arms. In some applications a loose assembly of standard roller mounting components may provide a sufficient range of motion.

A motor 39 coupled to one end of the roller 38 drives the upper brush in a clockwise direction relative to the frame 12 to polish the upper surface of the wafer 8 and move the wafer forward through the brush station 6. The rotational rate of the upper and lower brushes 14 and 16 may vary depending upon several factors as for example the compliance of the sleeves 20 and 36, the amount of cleaning desired and the length of the cleaning cycle. In the present embodiment, the upper and lower brushes 18 and 14 are rotated at a rate within the range of 80–150 rpm.

The brush assembly 10 further includes automated support assemblies 41 associated with each support arm 32 and 33 for supporting the upper brush 18 in one of a plurality of elevated positions relative to the lower brush 14 and automatically adjusting the pressure applied to the wafer surfaces by brushes 14 and 18. In the present embodiment, each support assembly 41 includes a stepping motor 42, a support pin 44 and a linkage mechanism 46 connecting the stepping motor 42 to the support pin 44 to move the support pin 44 in a vertical direction in response to the rotation of the stepping motor 42. The support pin 44 engages the underside of the support arm to support the arm in the selected vertical position. Preferably, the support pin 44 engages a portion of the support arm remote from the pivot 34 for greater control over the height of the upper brush 18. However, if desired the support pin 44 may be positioned to engage another portion of the support arm. In the embodiment shown in FIGS. 1–5, the support pin 44 may be moved 95 mm in 4000 discrete steps by the stepping motor, allowing for precise control of the vertical position of the upper brush 18. If desired, the displacement of the support pin 44 for each step of the stepping motor 42 and the total vertical displacement of the pin may be increased or decreased. A control system 52 automatically controls the operation of the stepping motor 42.

In the embodiment shown in FIGS. 1–5, the operator manually calibrates the elevation of the support arms 32 and 33 to orient the upper brush 18 so that the surfaces of the sleeves 20 and 36 are substantially parallel. The height of the support arms when the upper brush 18 is properly oriented provides a zero point or reference point. The orientation of the upper roller 38 must generally be recalibrated whenever the sleeves are replaced. Once the assembly is calibrated, the support assemblies 41 automatically adjust the height of the support arms relative to the reference point to accurately adjust the elevation of the upper brush 18 while maintaining the parallelism between the sleeves 20 and 36.

The pressure applied to the wafer surfaces by the brushes 14 and 18 is dependent upon the thickness of the wafer and the spacing between the sleeves 20 and 36. The amount of pressure applied to the wafer 8 may be increased or decreased by adjusting the height of the upper brush 18 relative to the lower brush 14. An operator measures the thickness of one or more wafers 8 in a batch to be cleaned. The thickness of the wafer 8 and the desired cleaning pressure is input into the control system 52, which actuates the stepping motor 42 to raise or lower the support arms 32 and 33 to obtain the required spacing between the upper and lower brushes. With the support assemblies 41 and the control system 52, the upper brush 18 may be accurately and efficiently moved to the appropriate height for cleaning a particular batch of semiconductor wafers 8.

When the sleeves 20 and 36 begin to wear, the spacing between the upper and lower brushes increases, reducing the pressure applied to the wafer surfaces. To ensure that sufficient cleaning pressure is applied to the wafers 8, the elevation of the brush carriage must be adjusted to maintain the required spacing between the surfaces of the sleeves 20 and 36. Preferably, the control system 52 is configured to periodically lower the brush carriage 16 in accordance with a predetermined schedule to accommodate wear of the sleeves. Thus, brush assembly 10 will apply a substantially uniform cleaning pressure across the surfaces of the wafer 8 during the life of the sleeves 20 and 36. Except for the initial calibration of the brush carriage 16, the elevation of the upper brush 18 relative to the lower brush 14 is controlled entirely by the control system 52 and the support assemblies 41.

The operation of the brush station 6 will be briefly described in relation to FIGS. 1 and 2. Once the thickness of the wafers 8 within a particular batch has been determined, the thickness and the cleaning pressure are input into the control system 52. The control system 52 actuates the stepping motors 42 to move the support arms 32 and 33 to the appropriate height. The operator then initiates the operation of the cleaning machine and the wafers 8 are automatically fed into the brush station from the supply cartridge (not shown). As is known in the art, the brush station includes tracks or rollers (not shown) for supporting the wafer 8 and moving it through the brush station to position the wafer between the upper and lower brushes 18 and 14. Liquid agents are sprayed onto the wafer 8 and/or the brushes 14 and 18 by injector nozzles (not shown). The sleeves 20 and 36 engage the surfaces of the wafer and move the wafer forward until it engages a pair of stop assemblies 60 which are pivotally mounted to the frame 12 adjacent the brushes.

The edge of the wafer 8 is engaged by rollers 62 mounted to the stop assemblies 60. The rollers 62 are rotated by suitable drive means (not shown) to spin the wafer relative to the upper and lower brushes. Spinning the wafer 8 at speeds in the range of 40–100 rpm ensures that the brushes will uniformly clean the entire surface of the wafer. After a predetermined period of time, the stop assemblies 60 are pivoted to move the rollers 62 away from the edge of the wafer and the wafer is allowed to move forward through the brush station 6 in the present embodiment, the wafer 8 passes from the brush station 6 into a second brush station 7. Although the brush stations 6 and 7 are substantially identical, the sleeves 20 and 36 and the liquid agents employed in the second brush station may differ from those in the first station 6 if desired. After a predetermined number of wafers 8 have passed through the brush station 6, the control system 52 automatically actuates the stepping motors 42, lowering the support pins 44 and the support arms 32 and 33 to accommodate wear of the sleeves. Since the control system 52 and the support assemblies 41 automatically adjust the height of the upper brush 18 relative to the lower brush 14, manual adjustment of the brush assembly 10 is generally not required until the sleeves 20 and 36 are replaced.

An adjustable brush assembly 10a in accordance with another embodiment of the present invention is shown in FIG. 6. The brush assembly 10a applies a uniform pressure to the wafer 8 during the cleaning cycle by automatically sensing the pressure applied to the wafer and making any necessary adjustments to the height and orientation of the upper brush 18a during the cleaning cycle. The brush assembly 10a accounts for differences in wafer thickness by detecting the increased pressure applied to the wafer surfaces by the thicker semiconductor wafer and raising the upper brush 18a. Wafers with various thicknesses may be cleaned by the brush assembly 10a without first measuring the thickness of the wafer and resetting the control system. Since the ends of the upper brush 18a are independently supported, the orientation of the upper brush may be adjusted to apply a uniform pressure to wafers having an uneven thickness. As the sleeves 20a and 36a wear, the decrease in pressure is detected and the support arms are automatically lowered to maintain the required cleaning pressure on the wafer surfaces.

As shown in FIG. 6, the back portion of the support arm 32a is coupled to the frame 12a by a spring assembly 70. The spring assembly 70 is used to determine the pressure applied across the wafer surfaces by the upper and lower brushes. The spring constant and damping coefficient of the spring assembly 70 are selected so that the spring assembly has sufficient sensitivity to accurately measure the actual cleaning pressure applied to the wafer surfaces. An adjustable counterweight 72 attached to the front portion of the support arm 32a substantially minimizes any offset of the elevation of the upper brush 18a which may be caused by the addition of the spring assembly 70. The deflection of the support arm 32a during operation of the brush assembly 10a is measured by a position sensor 74 attached to the support arm 32a. In the embodiment shown in FIG. 6, the position sensor 74 used to measure the vertical deflection of the support arm 32a is a linear variable-differential transformer. However, other position sensors which detect the linear or angular displacement of the support arm may also be employed. A control system 76 coupled to the position sensor 74 and the stepping motor 42a receives the output from position sensor and calculates the amount of pressure applied to the wafer by the upper brush 18a from the deflection of the support arm 32a and the value of the spring constant of the spring assembly 70. If the actual pressure applied across the wafer surfaces differs from the required cleaning pressure, the control system 76 actuates the stepping motor 42a to adjust the height of the support arms.

The spring assembly 70 shown in FIG. 6 provides a means for sensing the pressure exerted on the wafer surfaces by the upper and lower brushes. Instead of a spring assembly, other sensing means may be used as is shown for example in FIGS. 7–9. As shown in FIG. 7, the distal end of the support arm 32b of the brush assembly 10b is coupled to the frame 12b by a spring assembly 82. The spring assembly 82 has a sensor 84 such as a strain gauge for measuring the force applied to the spring assembly 82 by the support arm 32b. A control system 86 coupled to the sensor 84 receives the signal from the sensor and determines the pressure exerted on the wafer 8. If the actual pressure is different from the selected cleaning pressure, the control system 86 actuates the stepping motor 42b to raise or lower the upper brush 18b so that the desired cleaning pressure is applied across the wafer surfaces.

Turning to FIG. 8, the distal end of the support arm 32c of the brush assembly 10c is coupled to the frame 12c of the cleaning machine by a bellows assembly 92. During operation of the brush assembly 10c, the pressure within the bellows assembly 92 is detected by an air pressure sensor 94. The signal from the air pressure sensor 94 is transmitted to control system 96, which calculates the actual pressure applied by the brushes 14c and 18c from the air pressure in the bellows assembly 92. The control system 96 actuates the stepping motor 42c to change the height of the upper brush 18c if the actual pressure applied to the wafer surfaces is different than the required cleaning pressure.

In the embodiment shown in FIG. 9, a sensor 102 such as a strain gauge assembly is releasably connected to the distal end of the support arm 32d. The sensor 102 becomes separated from the support arm 32d when the upper brush 18d is raised to the initial alignment position and engages the support arm 32d when the upper brush 18d is lowered to an operating position. During operation of the brush assembly 10d, the sensor 102 measures the strain on the surface of the support arm 32d. Since the support arm 32d is essentially a cantilevered beam, the strain is proportional to the deflection of the beam. A control system 104 coupled to the sensor 102 receives the signal produced by the sensor and calculates the pressure exerted on the wafer by the brushes 14d and 18d from the strain measured by the sensor. The control system 104 compares the desired cleaning pressure with the actual pressure and, if any adjustments are necessary, actuates the stepping motor 42d to raise or lower the support arm 32d.

Another embodiment of the brush assembly 10e is shown in FIGS. 10 and 11. The support arm 32e of the brush assembly 10e are pivotally supported in a U-shaped bearing mount 112 which is secured to the frame 12e of the cleaning machine. A pressure adjustment assembly such as a direct current motor 114 is mounted to the U-shaped mount 112 and coupled to the support arm 32e by gear assembly 115 to control the pressure applied to the wafer 8 by the upper and lower brushes 18e and 14e. When current is supplied to the motor 114, the torque applied to the support arm 32e causes the upper brush 18e to exert a downward force on the wafer 8 and the lower brush 14e, thereby applying pressure across the upper and lower surfaces of the wafer. A weight 116 carried by the support arm 32e opposite the upper brush 18e ensures that the pressure applied to the wafer is proportional to the torque. The pressure applied across the upper and lower surfaces by the brushes 14e and 18e is proportional to the torque of the motor. Since the torque is proportional to the current supplied to the motor, the pressure applied across the wafer surfaces by the upper and lower brushes may be controlled by adjusting the supply of current to the motor.

A control system 118 coupled to the motor 114 controls the operation of the motor 114, causing the motor to apply the necessary torque to the support arm 32e to obtain the desired pressure across the surfaces of the wafer 8. A sensor 120 such as a strain gauge assembly attached to the support arm 32e and coupled to a control system 118 may be used to measure the pressure applied to the wafer 8. The control system 118 receives the output from the sensor 120 and uses the deflection of the support arm 32e to determine the actual pressure applied across the wafer surfaces. If the actual pressure differs from the selected cleaning pressure, the control system 118 regulates the operation of the motor 114 to adjust the pressure applied to the wafer by the upper and lower brushes.

Except as set forth above, the modifications of FIGS. 6, 7, 8, 9 and 10–11 resemble those of the preceding modifications and the same reference numerals followed by the subscripts a–e, respectively, are used to designate corresponding parts.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. An automatically adjustable brush assembly for cleaning semiconductor wafers comprising:

a first rotary brush carried by a frame;

a brush carriage having first and second arms pivotally coupled to said frame and a second rotary brush coupled to said first and second arms and extending transversely between said arms parallel to said first rotary brush, said second rotary brush being spaced from said first rotary brush by a distance such that during operation of said brush assembly, said first and second rotary brushes apply a selected cleaning pressure to a semiconductor wafer positioned between said first and second rotary brushes;

at least one support assembly positioned to engage one of said arms and support said brush carriage in one of a plurality of positions, said support assembly being configured for reciprocating movement of said brush carriage between said plurality of positions to selectively increase and decrease said distance between said first and second rotary brushes, said support assembly engaging a portion of said one of said arms spaced from the portion of said one of said arms pivotally coupled to said frame; and a control system coupled to said support assembly for controlling operation of said support assembly for moving said brush carriage to a selected one of said plurality of positions.

2. The brush assembly of claim 1 in which said support assembly is positioned to engage said first support arm, and further comprising a second support assembly positioned to engage a portion of said second arm spaced from the portion of said second arm pivotally coupled to said frame.

3. The brush assembly of claim 1 in which said support assembly includes a stepping motor and a support pin engaging said one of said arms and coupled to said stepping motor for reciprocating linear movement of said support pin relative to the revolution of said stepping motor to support said brush carriage in said one of said plurality of positions.

4. The brush assembly of claim 1 in which said first and second rotary brushes comprise a roller and a sleeve mounted to said roller.

5. The brush assembly of claim 1 in which said control system is configured for controlling operation of said support assembly to decrease said distance between said first and second rotary brushes in accordance with a predetermined schedule.

6. The brush assembly of claim 1, and further comprising at least one sensor assembly coupled to said control system and one of said arms for determining the actual pressure applied to said wafer by said first and second rotary brushes.

7. The brush assembly of claim 6 in which said control system is configured for comparing said actual pressure with said selected pressure and actuating said support assembly to move said brush carriage to another of said plurality of said positions to adjust the pressure applied to said wafer by said first and second rotary brushes.

8. The brush assembly of claim 1 in which said second rotary brush is coupled to said one of said arms at a position between the portion of said arm pivotally coupled to said frame and the portion of said arm engaged by said support assembly.

9. An automatically adjustable brush assembly for cleaning semiconductor wafers comprising:

a first rotary brush;

a brush carriage having first and second arms and a second rotary brush extending between said arms parallel to said first rotary brush, said second rotary brush being spaced from said first rotary brush by a distance such that during operation of said brush assembly, said first and second rotary brushes apply a selected cleaning pressure to a semiconductor wafer positioned between said first and second rotary brushes;

first and second support assemblies positioned to engage said first arm and said second arm, respectively, and support said brush carriage in one of a plurality of positions, said support assemblies each being configured for reciprocating movement of said brush carriage between said plurality of positions to selectively increase and decrease said distance between said first and second rotary brushes; and a control system coupled to said support assemblies for controlling operation of each of said support assemblies for moving said brush carriage to a selected one of said plurality of positions;

said second rotary brush being pivotally mounted to said first and second arms for multidirectional movement of said second rotary brush relative to said first and second arms.

10. The brush assembly of claim 9 in which said brush carriage includes a pair of spherical bearings pivotally mounting said second rotary brush to said first and second arms.

11. An automatically adjustable brush assembly for cleaning semiconductor wafers comprising:

a first rotary brush carried by a frame;

a brush carriage having first and second arms pivotally coupled to said frame and a second rotary brush extending transversely between said arms parallel to and spaced from said first rotary brush so that during operation of said brush assembly, said first and second rotary brushes apply a cleaning pressure to a semiconductor wafer positioned between said first and second rotary brushes;

at least one pressure adjustment assembly engaging one of said first and second arms of said brush carriage with the engaged portion of said one of said arms being spaced from said second rotary brush, said pressure adjustment assembly being configured for automatically adjusting the pressure applied to said wafer by said first and second rotary brushes; and a control system coupled to said pressure adjustment assembly for controlling operation of said pressure adjustment assembly to selectively increase and decrease the pressure applied to said wafer by said first and second rotary brushes.

12. The brush assembly of claim 11, in which said pressure adjustment assembly comprises a support assembly positioned to engage one of said arms of said brush carriage and support said brush carriage in a selected one of a plurality of positions, said support assembly being configured for reciprocating movement of said brush carriage between said plurality of positions to selectively increase and decrease said distance between said first and second rotary brushes.

13. The brush assembly of claim 11, in which said pressure adjustment assembly includes a motor coupled to said one of said arms at a position spaced from said second rotary brush for applying torque to said one of said arms to selectively increase and decrease the pressure applied to said wafer by said first and second rotary brushes.

14. The brush assembly of claim 13, and further comprising a sensor assembly coupled to said brush carriage and said control system for measuring the pressure applied to said wafer, and in which said control system is configured for receiving a signal from said sensor assembly and controlling said motor to selectively increase and decrease the torque applied to said one of said arms.

15. The brush assembly of claim 11, in which said pressure adjustment assembly is positioned to engage said first arm, and further comprising a second pressure adjustment assembly positioned to engage a portion of said second arm spaced from said second rotary brush.

16. The brush assembly of claim 11, and further comprising at least one sensor assembly coupled to said control system and one of said arms for determining the actual pressure applied to said wafer by said first and second rotary brushes.

17. The brush assembly of claim 16 in which said sensor assembly is configured for detecting the deflection of said one of said arms relative to said frame during operation of said brush assembly.

18. The brush assembly of claim 17 in which said control system is configured for calculating the actual pressure applied to said wafer from said deflection of said arm, comparing said actual pressure with the selected pressure, and initiating operation of said pressure adjustment assembly to selectively increase and decrease the pressure applied to said wafer by said first and second rotary brushes.

19. The brush assembly of claim 17 in which said sensor assembly includes a spring coupled to said one of said arms.

20. The brush assembly of claim 17 in which said sensor assembly comprises a bellows assembly coupled to said one of said arms.

21. An automatically adjustable brush assembly for cleaning semiconductor wafers comprising:

a first rotary brush;

a brush carriage having first and second arms and a second rotary brush extending between said arms parallel to and spaced from said first rotary brush so that during operation of said brush assembly, said first and second rotary brushes apply a cleaning pressure to a semiconductor wafer positioned between said first and second rotary brushes;

first and second pressure adjustment assemblies each engaging one said arms of said brush carriage, said pressure adjustment assemblies being configured for automatically adjusting the pressure applied to said wafer by said first and second rotary brushes; and a control system coupled to said pressure adjustment assemblies for controlling operation of each of said pressure adjustment assemblies to selectively increase and decrease the pressure applied to said wafer by said first and second rotary brushes;

said second rotary brush being pivotally mounted to said first and second arms for multidirectional movement of said rotary brush relative to said first and second arms.

* * * * *